United States Patent
Horng et al.

(10) Patent No.: US 8,372,661 B2
(45) Date of Patent: Feb. 12, 2013

(54) HIGH PERFORMANCE MTJ ELEMENT FOR CONVENTIONAL MRAM AND FOR STT-RAM AND A METHOD FOR MAKING THE SAME

(75) Inventors: Cheng T. Horng, San Jose, CA (US); Ru-Ying Tong, Los Gatos, CA (US); Chyu-Jiuh Torng, Pleasanton, CA (US); Witold Kula, Cupertino, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 392 days.

(21) Appl. No.: 11/981,127

(22) Filed: Oct. 31, 2007

(65) Prior Publication Data

US 2009/0108383 A1 Apr. 30, 2009

(51) Int. Cl.
*H01L 21/00* (2006.01)
(52) U.S. Cl. ...... 438/3; 257/295; 257/421; 257/E29.323
(58) Field of Classification Search .................. 257/295, 257/421, E29.363; 438/3
See application file for complete search history.

(56) References Cited

U.S. PATENT DOCUMENTS

| | | | |
|---|---|---|---|
| 6,452,204 B1 * | 9/2002 | Ishiwata et al. | 257/9 |
| 6,649,960 B1 | 11/2003 | Cross | |
| 6,760,250 B2 | 7/2004 | Kajiyama | |
| 6,960,480 B1 * | 11/2005 | Horng et al. | 438/3 |
| 7,009,877 B1 | 3/2006 | Huai et al. | |
| 7,274,080 B1 * | 9/2007 | Parkin | 257/421 |
| 2005/0184839 A1 | 8/2005 | Nguyen et al. | |
| 2007/0047159 A1 * | 3/2007 | Zhao et al. | 360/324.12 |
| 2007/0111332 A1 * | 5/2007 | Zhao et al. | 438/3 |
| 2008/0274567 A1 * | 11/2008 | Dahmani et al. | 438/3 |
| 2008/0299679 A1 * | 12/2008 | Zhao et al. | 438/3 |

FOREIGN PATENT DOCUMENTS

WO PCT/US2008/011314 11/2008

OTHER PUBLICATIONS

Co-pending U.S. Appl. No. 11/496,691, filed Jul. 31, 2006, A Novel Capping Layer for a Magnetic Tunnel Junction Device to Enhanced R/Rand a Method of Making the Same, assigned to the same assignee.
Co-pending U.S. Appl. No. 11/699,875, filed Jan. 30, 2007, A novel Magnetic Tunnel Junction (MTJ) to Reduce Spin Transfer Magnetization Switching Current, assigned to the same assignee as the present invention.

(Continued)

*Primary Examiner* — Zandra Smith
*Assistant Examiner* — Jamie C Niesz
(74) *Attorney, Agent, or Firm* — Saile Ackerman LLC; Stephen B. Ackerman

(57) ABSTRACT

A STT-RAM MTJ that minimizes spin-transfer magnetization switching current (Jc) is disclosed. The MTJ has a MgO tunnel barrier layer formed with a natural oxidation process to achieve a low RA (10 ohm-um$^2$) and a Fe or Fe/CoFeB/Fe free layer which provides a lower intrinsic damping constant than a CoFeB free layer. A Fe, FeB, or Fe/CoFeB/Fe free layer when formed with a MgO tunnel barrier (radical oxidation process) and a CoFeB AP1 pinned layer in a MRAM MTJ stack annealed at 360° C. provides a high dR/R (TMR)>100% and a substantial improvement in read margin with a TMR/Rp_cov=20. High speed measurement of 100 nm×200 nm oval STT-RAM MTJs has shown a $J_{c0}$ for switching a Fe free layer is one half that for switching an amorphous $CO_{40}Fe_{40}B_{20}$ free layer. A Fe/CoFeB/Fe free layer configuration allows the Hc value to be increased for STT-RAM applications.

11 Claims, 2 Drawing Sheets

OTHER PUBLICATIONS

"Progress and Outlook for MRAM Technology", by S. Tehrani et al., IEEE Trans. on Magnetics, vol. 35, No. 5, Sep. 1999, pp. 2814-2819.

"230 % room-temperature magnetoresistance in CoFEB/MgO/CoFeB magnetic tunnel junctions", by Djayaprawira et al., Applied Physics Letters 86, 092502 (2005), pp. 1-3.

Current-driven excitation of magnetic multilayers, by J.C. Slonczewski, Jrnl. of Magnetism and Magnetic Materials 159 (1996) L1-L7.

"High Speed Toggle MRAM with MgO-Based Tunnel Junctions", by J.M. Slaughter et al., Published in IEEE Int'l Electron Devices Meeting 2005, p. 35.7.1-2 (2005).

"A Novel Nonvolatile Memory with Spin Torque Transfer Magnetization Switching; Spin-RAM", by Hosomi et al., IDEM Paper by Sony, Dec. 2005.

"Current-Driven Magnetization Switching in CoFe B/MgO/CoFeB Magnetic Tunnel Junctions", by Hayakawa et al., Japanese Journal of Appl. Physics, vol. 44, No. 41, 2005, pp. L1267-L1270.

"Spin Transfer Switching Current Reduction in Magnetic Tunnel Junction Based Duel Spin Filter Structure", by Yiming Huai et al., Applied Physics Lett. 87,222510 (2005) pp. 1-3.

"Excellent Scalability and Switching Characteristics in Spin-Transfer Torque MRAM", by S.C.Oh et al., IEDM 2006, 288.1.jps, #288, p. 1-3.

"Study of the dynamic magnetic properties of soft CoFeB films", by C. Bilzer et al., Jrnl. of Applied Pgysics 100, 053903 (2006), pp. 1-4.

"Magnetic Damping in Feromagnetic Thin Films", by Oogame et al., Jpn. J. Appl. Phys. vol. 45, No. 5A (2006), pp. 3889-3891, Magnetization Dynamics in Spintranic Structures and Devices.

MRAM Becomes Standard Product at Freescale <b> (Updated) </b>, by Peter Clarke, Silicon Strategies, Sep. 23, 2004 (9:51 PM EDT), URL: http://eet.com/article/showArticle.jhtml?articleId=47902247.

* cited by examiner

HIGH PERFORMANCE MTJ ELEMENT FOR CONVENTIONAL MRAM AND FOR STT-RAM AND A METHOD FOR MAKING THE SAME

RELATED PATENT APPLICATIONS

This application is related to the following: Ser. No. 11/496,691, filing date Jul. 31, 2006; and Ser. No. 11/699,875, filing date Jan. 30, 2007, both assigned to a common assignee and herein incorporated by reference in their entirety.

FIELD OF THE INVENTION

The invention relates to a high performance Magnetic Tunneling Junction (MTJ) element and a method for making the same, and more particularly, to free layer made of Fe or Fe/CoFeB/Fe that improves the performance of conventional MRAM devices, and reduces spin transfer magnetization switching current in STT-RAM devices.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. as presented by S. Tehrani et al. in "Progress and Outlook for MRAM Technology", IEEE Trans. on Magn., Vol. 35, pp. 2814-2189 (1999). A MRAM device is generally comprised of an array of parallel first conductive lines on a horizontal plane, an array of parallel second conductive lines on a second horizontal plane spaced above and formed in a direction perpendicular to the first conductive lines, and a MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). There are typically other devices including transistors and diodes below the array of first conductive lines as well as peripheral circuits used to select certain MRAM cells within the MRAM array for read or write operations. MTJ cells are typically inserted into the back end of a CMOS process. A high speed version of MRAM architecture consists of a cell with an access transistor and a MTJ (1T1MTJ) in the array.

A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction. In a MRAM MTJ, the free layer has traditionally been made of NiFe because of its reproducible and reliable switching characteristics as demonstrated by a low switching field (Hc) and low switching field uniformity (σHc).

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. One line (bit line) provides the field parallel to the easy axis of the bit while another line (digit line) provides the perpendicular (hard axis) component of the field. The intersection of the lines generates a peak field that is engineered to be just over the switching threshold of the MTJ.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_s$) value are desirable for conventional MRAM applications. For Spin-RAM (STT-RAM), a high $\lambda_s$ and high Hc leads to high anisotropy for greater thermal stability. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance x area (RA) value and a high breakdown voltage (Vb), it is necessary to have a uniform tunnel barrier layer which is free of pinholes that is promoted by a smooth and densely packed growth in the AFM and pinned layers. RA should be relatively small (<2000 ohm-$\mu m^2$) for MTJs that have an area defined by an easy axis and hard axis dimensions of less than 1 micron. Otherwise, R would be too high to match the resistance of the transistor which is connected to the MTJ.

In MRAM MTJ technology, Rp is the MTJ resistance for free layer magnetization aligned parallel to pinned layer magnetization (which is fixed). Rap is the resistance of free layer magnetization aligned anti-parallel to the pinned layer magnetization. Uniformity of the TMR ratio and the absolute resistance of the MTJ cell are critical in the MRAM architecture since the absolute value of MTJ resistance is compared with a reference cell during read mode. If the active device resistances in a block of memory show a large resistance variation (i.e. high Rp_cov, Rap_cov), a signal error can occur when they are compared with a reference cell. In order to have a good read operation margin, TMR/Rp_cov (or TMR/Rap- _cov) should have a minimum value of 12, and preferably >15, and most preferably a value ≧20.

The first MRAM product, Freescale's 4 Mb MR2A16A, was introduced in a publication "MRAM becomes standard product at Freescale", EE Times, Sep. 24, 2004. The 4 Mb MRAM array configuration is made of CoFe/AlOx/NiFe (pinned/tunnel/free layer) and MTJ devices of 0.4×0.8 micron oval size are fabricated by using a 180 nm technology node. Until recently, such MTJ devices were made with AlOx tunnel barriers and a NiFe free layer to produce a TMR in the 40-50% range that works well in MRAM. The read margin for MRAM circuits, defined as TMR (0.4V biased)/Rp_cov is >20. TMR values well over 200% have been reported for a MTJ based on a CoFeB/MgO/CoFeB pinned/tunnel/free layer configuration by D. Djayaprawira et al. in "230% room-temperature magnetoresistance in CoFeB/MgO/CoFeB magnetic tunnel junctions", Appl. Phys. Lett., 86, 092502 (2005). Unfortunately, these MTJ devices do not have the magnetic properties such as low magnetostriction (λs) and low intrinsic anisotropy (Hc) needed for magnetic switching for MRAM circuits.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed and described by J. Slonecżewski in "Current-driven excitation of magnetic multilayers", J. Magn. Materials V 159, L1-L7 (1996). Compared with conventional MRAM, spin-transfer torque (STT)-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

In order for conventional MRAM and STT-RAM to be viable in the 90 nm technology node and beyond, MTJs must exhibit a TMR ratio that is much higher than in a conventional MRAM-MTJ which uses AlOx as the tunnel barrier and a NiFe free layer. For example, a higher TMR ratio of >80% is achieved in an unpatterned MTJ with a CoFeB/MgO/NiFe configuration according to J. Slaughter et al. in "High speed toggle MRAM with MgO-based tunnel junctions", IEEE IEDM, p. 35.7.1-3 (2005). However, testing of MRAM circuits having MTJs of 0.26 μm×0.52 μm (oval) bit size has shown a read margin TMR (0.35V)/Rp_cov=12 which is far short of Freescale's 4 Mb MRAM that has a read margin >20.

A critical current for spin transfer switching (Ic), which is defined as $[(Ic^+ + Ic^-)/2]$, for the present 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgOx, or the like. In order for spin-transfer magnetization switching to be viable in the 90 nm technology node and beyond, the critical current density (Jc) must be lower than $10^6$ A/cm$^2$ to be driven by a CMOS transistor that can typically deliver 100 μA per 100 nm gate width. To apply spin-transfer switching to MRAM technology, it is desirable to decrease Ic (and its Jc) by more than an order of magnitude so as to avoid an electrical breakdown of the MTJ device and to be compatible with the underlying CMOS transistor that is used to provide switching current and to select a memory cell. A means to improve the dielectric breakdown voltage is also an important consideration.

The intrinsic critical current density (Jc) as given by Slonczewski of IBM is shown in equation (1) below.

$$Jc = 2e\alpha Mst_F(Ha + H_k + 2\pi Ms)/\hbar \eta \quad (1)$$

where e is the electron charge, α is a Gilbert damping constant, $t_F$ is the thickness of the free layer, $\hbar$ is the reduced Plank's constant, η is the spin-transfer efficiency which is related to the spin polarization (P), Ha is the external applied field, and $H_k$ is the uniaxial anisotropy field, and 2π Ms is the demagnetization field of the free layer.

Normally, the demagnetizing field, 2πMs (several thousand Oe term) is much larger than the uniaxial anisotropy field Hk and external applied field (approximately 100 Oe) Ha term, hence the effect of Hk and Ha on Jc are small. In equation (2), V equals Ms($t_F$A) and is the magnetic volume which is related to the thermal stability function term $K_u$V/$k_b$T where $K_u$ is the magnetic anisotropy energy and $k_b$ is the Boltzmann constant.

$$Jc \propto \alpha MsV/\hbar \eta \quad (2)$$

Other publications in the prior art relating to STT-RAM structures include the following: M. Hosomi et al. in "A novel non-volatile memory with spin torque transfer magnetization switching: Spin-RAM", 2005 IEDM, paper 19-1; J. Hayakawa et al. entitled "Current-driven magnetization switching in CoFeB/MgO/CoFeB magnetic tunnel junctions", Japn. J. Appl. Phys. V44, p. 1267 (2005); and Y. Huai et al., "Spin transfer switching current reduction in magnetic tunnel junction based dual spin filter structures", Appl. Phys. Lett. V 87, p. 222510(2005). A Jc>2×10$^6$ A/cm$^2$ for a CoFe(B)/MgO/CoFeB MTJ of sub-100 nm size is reported but is too high to be acceptable for a STT-RAM application.

In other prior art references, U.S. Patent Application Publication No. 2005/0184839 teaches ferromagnetic doping and/or non-magnetic dilution of the free layer to provide low saturation magnetization for STT-RAM applications.

U.S. Pat. No. 6,649,960 describes a synthetic anti-ferromagnetic free layer made of two ferromagnetic layers that are anti-ferromagnetically coupled to reduce the effective free layer thickness and thereby lower the switching field in a MRAM cell.

Further improvement in MRAM and STT-RAM technology is necessary before a viable product based on the 90 nm technology node is achieved. In particular, a combination of a high TMR ratio, TMR/Rp_cov ratio>15, and a low Jc of less than 2×10$^6$ A/cm$^2$ are desirable.

SUMMARY OF THE INVENTION

One objective of the present invention is to provide a MTJ element for a 90 nm MRAM cell in which intrinsic and operational (biased) TMR ratio, dR/R, and TMR/Rp_cov are significantly enhanced over prior art devices.

A second objective of the present invention is to provide an MTJ element for a STT-RAM in which Jc is preferably $<2\times10^6$ A/cm$^2$ to facilitate magnetization switching of the free layer without negatively affecting the tunnel barrier layer.

According to one embodiment, these objectives are achieved by providing a substrate comprised of a bottom conductor electrode on which a MRAM structure is to be fabricated. A MTJ element is formed by first depositing a stack of layers on the bottom conductor electrode. In one aspect, the MTJ stack has a bottom spin valve configuration in which a seed layer, AFM layer, synthetic anti-ferromagnetic (SyAF) pinned layer, tunnel barrier layer, free layer, and a capping layer are sequentially formed. Preferably, the pinned layer has a synthetic anti-ferromagnetic (SyAF) configuration wherein a Ru coupling layer is sandwiched between a lower CoFe (AP2) layer and an upper amorphous CoFeB (AP1) layer. The tunnel barrier layer is preferably comprised of crystalline MgO made by a radical oxidation method. Above the tunnel barrier layer is a free layer comprised of Fe or FeB$_x$ where x is from 0 to 5 atomic %. A NiFeHf/Ta/Ru capping layer may be employed on the free layer.

All of the layers in the MTJ stack are formed by sputtering or ion beam deposition (IBD). The MgO tunnel barrier layer is typically formed by depositing a first Mg layer, oxidizing the metal by a radical oxidation (ROX) method, and then depositing a second Mg layer on the oxidized first Mg layer. The MTJ is advantageously annealed at a temperature in the range of about 250° C. to 360° C. to ensure a high TMR ratio. Once all the layers in the stack are laid down and thermally annealed to fix the pinned layer magnetization direction, a conventional patterning and etching sequence is followed to fabricate a MTJ element. Thereafter, a dielectric layer is typically deposited on the substrate and MTJ, and is thinned to be coplanar with the capping layer. A top conductor may then be formed on the MTJ and dielectric layer.

In a second embodiment, the MTJ element in the first embodiment is modified to provide optimum performance for a STT-RAM device. A CoFeB/CoFe AP1 layer may be employed and the tunnel barrier formation is comprised of depositing a Mg layer, oxidizing the Mg layer with a natural oxidation (NOX) process, and then depositing a second Mg layer on the oxidized Mg layer in order to achieve a low RA of about 10 to 20 ohm-um$^2$. In addition, the capping layer may be a composite having a Ta/Ru composition. The AP1 layer has a CO$_{60}$Fe$_{20}$B$_{20}$/CO$_{75}$Fe$_{25}$ or CO$_{75}$Fe$_{25}$ configuration in which the CO$_{75}$Fe$_{25}$ portion has a body centered cubic (bcc) structure that is advantageously employed to grow an overlying (001) MgO tunnel barrier. Furthermore, the Fe or FeB$_x$ free layer may be replaced with a Fe/CoFeB/Fe free layer.

DETAILED DESCRIPTION OF THE INVENTION

The present invention is a MTJ configuration that provides improved performance for both conventional MRAM and spin transfer (STT-RAM) applications. Drawings are provided by way of example and are not intended to limit the scope of the invention. Further, the drawings are not necessarily drawn to scale and the relative sizes of various elements may differ from those in an actual device.

Figure 1:
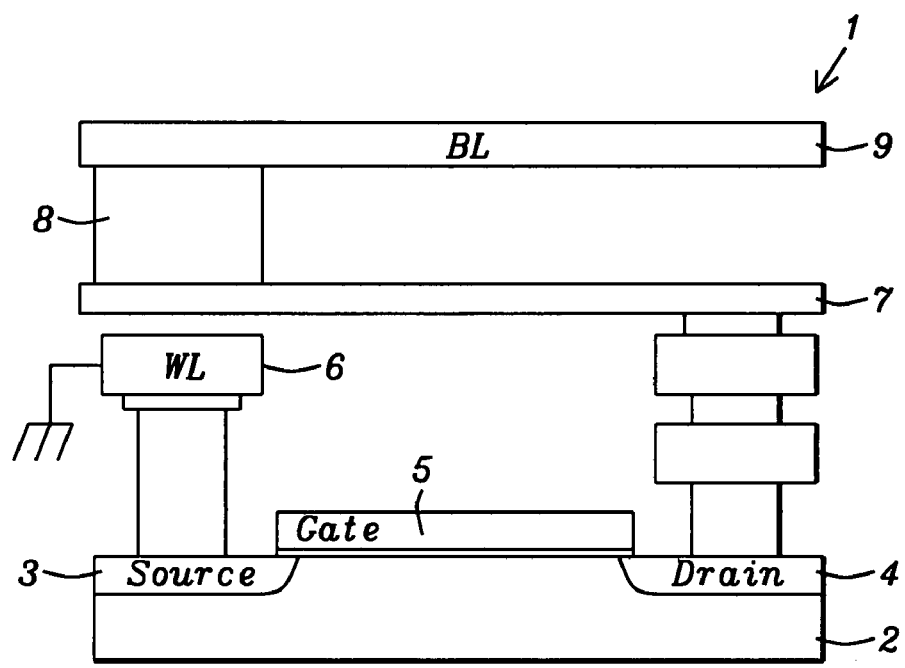
FIG. 1 is a cross-sectional view showing a memory cell in a STT-RAM device.

Referring to FIG. 1, one embodiment of the present invention comprises a memory cell 1 of a STT-RAM that may be based on a p-type semiconductor substrate 2, for example, that provides current for switching the free layer (not shown) in MTJ 8. The STT-RAM device 1 also comprises a source 3, drain 4, gate 5, word line (WL) 6, bottom electrode 7, and bit line (BL) 9.

Figure 2:
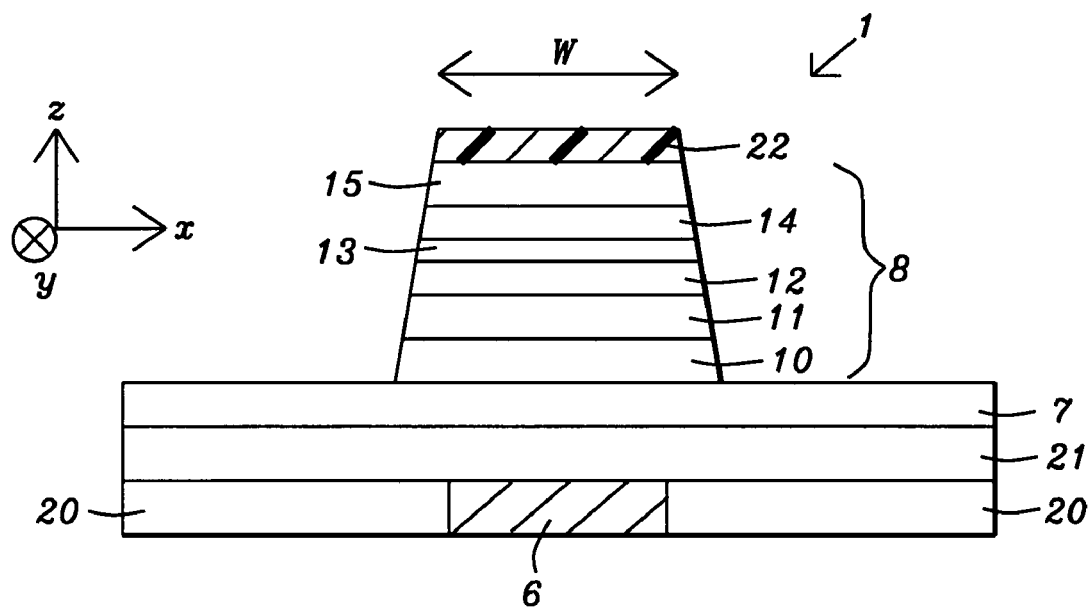
FIG. 2 is cross-sectional view of a MTJ according to one embodiment of the present invention.

A Spin-RAM (STT-RAM) structure formed according to a first embodiment of the present invention will now be described. Referring to FIG. 2, a partially completed STT-RAM structure 1 is shown that includes the word line 6 formed within a first insulation layer 20 comprised of Al$_2$O$_3$, silicon oxide, or the like. The first insulation layer 20 is typically formed on a conventional substructure as understood by those skilled in the art. The word line 6 may be made of copper, for example, and is a first conductive line that is electrically connected to the transistor source electrode (not shown). Optionally, the first conductive line may be called a digit line, data line, source line, or column line as appreciated by those skilled in the art. Note that unlike conventional MRAM, magnetization switching in the STT-RAM MTJ is accomplished by passing current through the MTJ and not by fields induced by current in the word line and bit line.

There is a second insulation layer 21 such as Al$_2$O$_3$ or silicon oxide formed on the word line 6 and first insulation layer 20. Above the second insulation layer 21 is a bottom conductor layer 7 that is interconnected to an underlying transistor (not shown) in the substructure. The bottom conductor layer 7 may be a composite layer comprised of a lower seed layer, middle conductive layer, and upper capping layer (not shown). Furthermore, word line 6 and bottom conductor layer 7 may be connected to the source 3 and drain 4, respectively, of a transistor element that is depicted in FIG. 1.

It should be understood that the STT-RAM structure is part of an array in which multiple parallel word lines are formed in a first conductive layer and multiple top conductor electrodes such as parallel bit lines are formed in a second conductive layer above an array of MTJs. Alternatively, the first conductive layer may be parallel bit lines while the second conductive layer is parallel word lines. The word lines and bit lines are aligned orthogonal to each other and a bottom conductor layer may be used to connect each MTJ element with a transistor in the substrate. In the exemplary embodiment, an MTJ element is formed between a bottom conductor layer 7 and bit line 9 at each location where a bit line crosses over a word line 6.

The bottom conductor layer 7 may be a sectioned line, for example, that has a rectangular shape in the x, y plane and a thickness in the z direction. Alternatively, the bottom conductor layer 7 may be a bit line that is aligned orthogonally to an underlying word line 6 and to a subsequently formed second word line (not shown) above the MTJ. In one embodiment where the bottom conductor layer 7 has a seed layer/conductive layer/capping layer configuration, the seed layer may be comprised of NiCr, Ta, or TaN. The conductive layer may be made of Ru, Rh, Ir or other metals such as Au, Cu, or α-Ta. The capping layer may be an amorphous Ta layer, for example, that serves to promote uniform and dense growth in subsequently formed MTJ layers.

A MTJ stack of layers is now formed on the bottom conductor layer 7. The MTJ stack 8 may be formed in the same process tool as the bottom conductor layer. For instance, the bottom conductor layer 7 and MTJ stack 8 may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom conductor layer 7 and overlying MTJ layers 10-15 may be formed after a single pump down of the sputter system to enhance throughput.

In a preferred embodiment, the MTJ stack 8 is fabricated on the bottom conductor layer 7 by sequentially forming a seed layer 10, AFM layer 11, SyAF pinned layer 12, tunnel barrier layer 13, free layer 14, and a capping/hard mask layer 15. The seed layer 10 may be comprised of NiCr, NiFe, NiFeCr, or other suitable seed layer materials and has a thickness of about 40 to 60 Angstroms. When the seed layer 10 is grown on an amorphous Ta capping layer in the bottom conductor layer 7, a smooth and dense (111) seed layer structure results that promotes smooth and densely packed growth in subsequently formed MTJ layers.

The AFM layer 11 is preferably made of MnPt with a thickness of about 100 to 200 Angstroms and more preferably 150 Angstroms although an IrMn layer having a thickness from about 50 to 100 Angstroms or a film made of NiMn, OsMn, RuMn, RhMn, PdMn, RuRhMn, or MnPtPd or the like is also acceptable. In the exemplary embodiment, the AFM layer is magnetically aligned in the y-axis direction. An external magnetic field may be applied during the deposition of a MTJ layer such as an AFM layer or a ferromagnetic (FM) layer to influence a magnetization along a certain axis.

The synthetic anti-ferromagnetic (SyAF) pinned layer 12 has an AP2/coupling layer/AP1 configuration. Use of a SyAF pinned layer in the MTJ structure not only improves thermal stability but also reduces the interlayer coupling field (offset field) applied to the free layer. The AP2 layer (not shown) is formed on the AFM layer 11 and is preferably comprised of CoFe with a composition of about 25 atomic % Fe and with a thickness of about 20 to 30 Angstroms and more preferably 23 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAF pinned layer 12 along the y-axis. Exchange coupling between the AP2 layer and the AP1 layer is facilitated by a coupling layer that is preferably comprised of Ru with a thickness of about 7.5 Angstroms although Rh or Ir may be used instead of Ru.

In a first embodiment, the AP1 layer on the Ru coupling layer is a composite with a lower amorphous CoFeB layer about 15 Angstroms thick formed on the coupling layer and an upper CoFe layer about 6 Angstroms thick. The lower CoFeB layer may have a composition of about 40 to 60 atomic % Co, 20 to 40 atomic % Fe, and 15 to 25 atomic % B, and preferably 60 atomic % Co, 20 atomic % Fe, and 20 atomic % B. It is important that the B content be at least 15% in order to achieve an amorphous CoFeB layer. A robust pinned layer 12 may be obtained by using high Hc (λs) ferromagnetic AP1 and AP2 layers. The upper CoFe layer in an AP1 composite may have a composition represented by $Co_{75}Fe_{25}$. Optionally, a single CoFeB layer may be employed as the AP1 layer since crystalline CoFeB by a subsequent high temperature annealing yields a higher polarization factor than CoFe to enhance TMR.

Above the SyAF pinned layer 12 is formed a thin tunnel barrier layer 13 that is preferably MgO. Unlike a method commonly used in the prior art where a MgO tunnel barrier is formed by a sputter deposition method, the inventors advantageously employ a procedure where a Mg layer about 6 to 8 Angstroms thick is deposited followed by an in-situ natural oxidation (NOX), and then deposition of an additional Mg layer about 3 to 5 Angstroms thick. The resulting MgO tunnel barrier is highly (001) oriented and is believed to have a thickness greater than 10 Angstroms. A NOX process is preferred over a radical oxidation (ROX) process in order to achieve a RA target in the range of 10-20 ohm-um$^2$ that is desired for STT-RAM devices. ROX processes tend to give higher RA values. The tunnel barrier layer 13 has excellent smoothness and uniformity in part because of the smooth underlying MTJ layers. The NOX process is preferably performed in an oxidation chamber within the sputter deposition system. NOX process conditions may be comprised of a 1 torr pressure and an oxygen flow rate of from 0.1 to 1.0 slm and preferably 1 slm for about 60 to 100 seconds to oxidize the Mg layer on the SyAF pinned layer 12.

It has been shown that a MTJ made with a crystalline (001) MgO barrier layer and a CoFeB free layer is capable of delivering a very high dR/R as described in the prior art references. High dR/R is a result of coherent tunneling in which electron symmetry of the ferromagnetic electrode is preserved in tunneling through the crystalline MgO barrier. However, a CoFeB free layer is also associated with a higher intrinsic damping constant than is desired for STT-RAM devices.

A key feature of the present invention is the free layer 14 formed on the tunnel barrier layer 13. The inventors have discovered that a free layer 14 made of crystalline Fe provides a substantially higher TMR ratio and a higher TMR/Rp_cov ratio than a conventional CoFeB free layer for STT-RAM. Furthermore, a Fe free layer formed on a MgO tunnel barrier is surprisingly found to have a low Hc value which is unexpected because of the high Hc values typically realized for Fe, Co, or CoFe free layers formed on an AlOx tunnel barrier. The Fe free layer 14 has a (001) crystal orientation to match that of the MgO tunnel barrier layer 13 and thereby promote coherent tunneling. The Fe free layer 14 has a thickness between 21 and 25 Angstroms and is magnetically aligned along the y-axis (pinned layer direction). When the MTJ is elliptically shaped as seen in a top view (not shown), the easy axis of the MTJ element is along the long axis (y-direction). The Fe free layer 14 is advantageously used to lower the intrinsic damping constant of a STT-RAM MTJ from a value of α=0.0038 for amorphous $Co_{40}Fe_{40}B_{20}$ in the prior art to about α=0.002 in one embodiment of the present invention.

In an alternative embodiment, the free layer 14 may have a Fe/CoFeB/Fe configuration to tune Hc to a substantially higher value than for a single Fe free layer. Preferably, the lower Fe layer is from 3 to 5 Angstroms thick, the middle CoFeB layer is 10 to 12 Angstroms thick, and the upper Fe layer is 5 to 6 Angstroms thick.

The present invention also anticipates that a small amount of B of up to about 5 atomic % may be added to a Fe free layer in order to improve thermal stability. Thus, the free layer 14 may be represented by $FeB_x$ where x is between 0 and 5 atomic %.

In the STT-RAM embodiment of the present invention, the capping layer 15 is preferably Ta. However, a Ta/Ru capping layer configuration may be employed. Note that the capping layer 15 may also serve as a hard mask during a subsequent reactive ion etch (RIE) step and thereby prevents excessive thinning of the MTJ stack of layers that would degrade device performance.

The present invention also encompasses an annealing step after all of the MTJ layers have been deposited. For example, in the exemplary embodiment, the MTJ stack of layers having an MgO tunnel barrier layer may be annealed in a vacuum by applying a magnetic field of 5000 to 10000 Oe in magnitude along the y-axis (easy axis) for 1 to 5 hours at a temperature of about 300° C. to 350° C.

After all of the MTJ layers have been deposited and annealing is completed, a MTJ element with sidewalls is fabricated by first coating and patterning a photoresist layer 22 that has a width w on the capping layer 15. Next, the photoresist layer 22 is employed as an etch mask during an IBE or Reactive Ion Etch (RIE) sequence that removes regions of the MTJ stack 8 which are not protected by the etch mask. The Ta capping layer 15 preferably has a thickness of about 400 to 600 Angstroms thick in order to function as an effective hard mask. The patterned photoresist layer 22 serves as an etch mask during a RIE process to remove unprotected regions of the hard mask layer. Then the photoresist layer 32 is stripped and the hard mask serves as a mask for a second RIE process that etches unprotected regions of MTJ layers 10-14. As a result, a MTJ element may be formed having sloped sidewalls in which the capping layer 15 has a width w and the seed layer 10 has a width greater than w.

Figure 3:
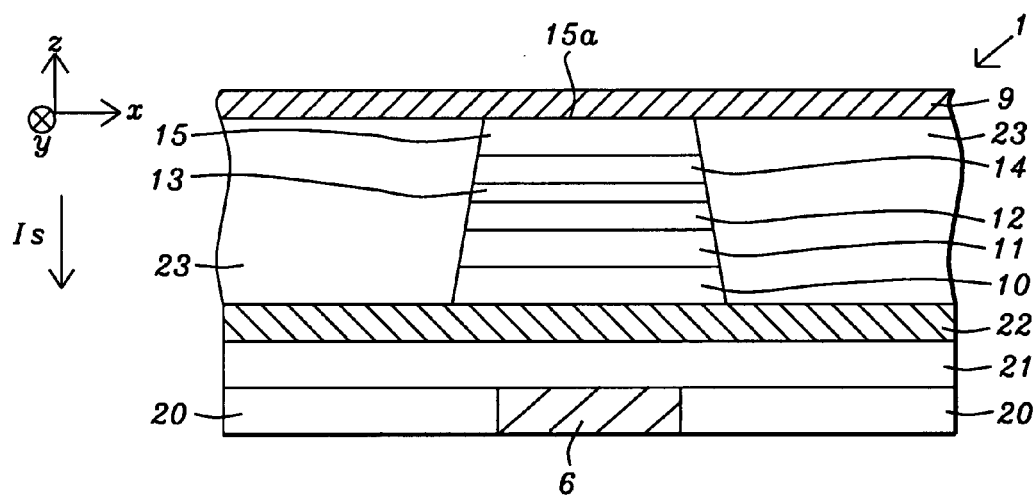
FIG. 3 is a cross-sectional view of a partially formed STT-RAM that has an MTJ structure according to one embodiment of the present invention.

Referring to FIG. 3, the photoresist layer 22 is removed after the aforementioned IBE or RIE etch sequence by a conventional method that may involve a wet stripper or an oxygen ashing process. A standard cleaning step may be performed at this point to ensure that all organic residue is removed after the stripping step. Then a third insulation layer 23 is formed on the bottom electrode 7 and adjacent to the MTJ sidewalls by a conventional method that may involve depositing an insulation material with an appropriate dielectric constant and then planarizing the third insulation layer 23 to be coplanar with the top surface 15a of the MTJ element.

The next step in fabricating the MRAM cell 1 is to form a top conductor (bit line) 9 on the third insulation layer 23. The bit line 9 contacts the top surface 15a of the MTJ element and is typically aligned in a direction orthogonal to that of the word line 6 and may be comprised of more than one layer. For instance, a top conductor layer such as Cu, Au, Ru, or Al may be enclosed on the sides and bottom by a diffusion barrier layer, which is also an adhesion layer, as appreciated by those skilled in the art. In the exemplary embodiment, the bit line 9 is used as a write line to carry current Is that passes through the MTJ in a CPP (current perpendicular to plane) configuration. The spin-transfer effect arises from the spin-dependent electron transport properties of ferromagnetic-insulator-ferromagnetic multilayers. When a spin-polarized current transverses a magnetic multilayer in a CPP configuration, the spin angular moment of electrons incident on a ferromagnetic free layer interacts with magnetic moments of the free layer near the interface with the tunnel barrier layer. Through this interaction, the electrons transfer a portion of their angular momentum to the free layer. As a result, a spin-polarized current can switch the magnetization direction of the free layer if the current density is sufficiently high, and if the dimensions of the multilayer are small. In addition, for spin transfer to be able to switch the magnetization direction of the free layer 14, the free layer must be sufficiently thin.

Figure 4:
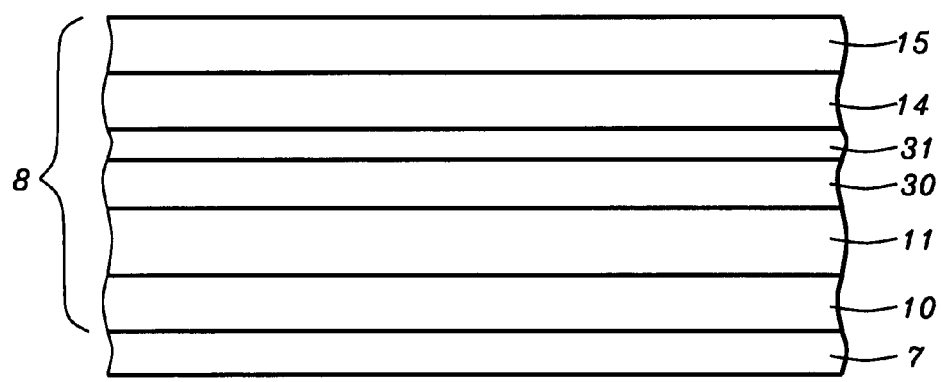
FIG. 4 is a cross-sectional view of the STT-RAM structure in FIG. 3 after a photoresist mask is removed and an insulation layer is formed adjacent to the MTJ element and a bit line is formed on the top surface of the MTJ element.

Referring to FIG. 4, a second embodiment of the MTJ stack is shown that may be advantageously used in a conventional MRAM configuration. The MTJ stack 8 is similar to that of the first embodiment (STT-RAM) except the AP1 portion of pinned layer 30 is preferably comprised of a single CoFeB layer that has a thickness between 20 and 25 Angstroms and a composition of about 40 to 60 atomic % Co, 20 to 40 atomic % Fe, and 15 to 25 atomic % B, and preferably 60 atomic % Co, 20 atomic % Fe, and 20 atomic % B. Otherwise, the AP2 and coupling layer portions of the pinned layer 30 are the same as in pinned layer 12 of the first embodiment. Furthermore, the MgO tunnel barrier layer 13 is preferably fabricated by initially depositing a Mg layer about 8 to 12 Angstroms thick, performing a radical oxidation (ROX) method, and then depositing a second Mg layer about 2 to 4 Angstroms thick. The desired RA value for an MRAM MTJ is about 500 ohm-um$^2$ for the current generation devices that have a minimum feature size of about 90 nm. Since the MRAM MTJ RA target value is substantially higher than for a STT-RAM MTJ, a ROX process is used to oxidize the initially deposited Mg layer and a thicker MgO barrier layer is typically formed than in a STT-RAM MTJ to intentionally increase the RA. In one embodiment, the ROX process is comprised of a RF power of 500 to 800 Watts and an oxygen flow rate of 0.4 to 0.8 standard liters per minute (slm) and preferably 0.6 slm for a period of about 80 to 150 seconds.

A key feature of the present invention is the free layer 14 formed on the tunnel barrier layer 13. The inventors have discovered that a free layer 14 made of crystalline Fe provides a substantially higher TMR ratio and a higher TMR/Rp_cov ratio than a NiFe free layer used in conventional MRAM devices. Furthermore, a Fe free layer formed on a MgO tunnel barrier is surprisingly found to have a low Hc value which is unexpected because of the high Hc values typically realized for Fe, Co, or CoFe free layers formed on an AlOx tunnel barrier. The Fe free layer 14 has a (001) crystal orientation to match that of the MgO tunnel barrier layer 13 and thereby promote coherent tunneling. The Fe free layer 14 has a thickness between 21 and 25 Angstroms and is magnetically aligned along the y-axis (pinned layer direction).

The present invention also anticipates that a small amount of B of up to about 5 atomic % may be added to a Fe free layer in order to lower Hc and improve thermal stability. Thus, the free layer 14 may be represented by $FeB_x$ where x is between 0 and about 5 atomic %.

In a conventional MRAM embodiment, the capping layer 15 may be a composite with a lower NiFeHf layer, a middle Ta layer, and an upper Ru layer to achieve low Hc and low $\lambda_s$ as previously disclosed in MagIC Technologies, Corp. patent application HMG06-011/012 which is herein incorporated by reference in its entirety. Optionally, the capping layer 15 may be NiFeHf/Ta, Ta/Ru, Ru/Ta/Ru or other capping layer compositions used in the art. It is believed that a capping layer with a lower NiFeHf layer that contacts the free layer 14 has the effect of reducing the magnetic "dead layer" at the free layer/capping layer interface. The so-called magnetic dead layer is typically a 3 to 6 Angstrom thick interface between the free layer and capping layer wherein some intermixing of layers has occurred. The mechanism for enhancing TMR (dR/R) is believed to be based on a capping layer that is highly effective in gettering oxygen from an adjacent free layer. Hf is preferred over other elements such as Ta as an oxygen gettering agent because it has a higher oxidation potential. Hf also has a higher oxidation potential than Ni, Fe, and Co and therefore is very effective in gettering oxygen from an adjacent free layer that is comprised of one or more of those elements. The upper Ru layer ensures good electrical contact with an overlying bit line (not shown), is inert to oxidation during annealing, and is a low resistance conductor.

The stack of layers in the MRAM MTJ may be annealed along an easy axis direction by applying a magnetic field of 5000 to 10000 Oe at a temperature between 250° C. and 360° C., and preferably from 330° C. to 360° C. for 1 to 5 hours. Thereafter, a MTJ element may be formed by a patterning and etching process described previously.

Comparative Example 1

An experiment was conducted to compare the performance of a MRAM MTJ fabricated according to the second embodiment of the present invention (Fe free layer) with a MRAM MTJ based on a prior art NiFe free layer. The MTJ stack for both configurations is formed on a Ta/Ru200/α-Ta100 bottom electrode and has the following succession of layers in order from bottom to top: 45 Angstrom NiCr seed layer; 150 Angstrom MnPt AFM layer; $CO_{75}Fe_{25}23/Ru7.5/CO_{60}Fe_{20}B_{20}21$ SyAF pinned layer; MgO tunnel barrier; free layer; and a NiFeHf/Ta/Ru or Ta/Ru capping layer in which Ta thickness is 30 Angstroms and Ru thickness is 100 Angstroms. The MgO layer was formed by first depositing a 10 Angstrom thick Mg layer followed by a ROX process (500 Watts, 140 seconds, 0.6 standard liters per minute of $O_2$) and then deposition of a 3 Angstrom thick Mg layer. Annealing was performed for 2 hours at the indicated temperature. Magnetic performance properties were measured using CIPT and a B—H looper.

We have fabricated 1 Mb MRAM cells with a 90 nm MTJ design rule and a MTJ element size of 0.2 μm×0.37 μm. MTJs were made with a reference configuration (row 1) and with a Fe free layer according to the present invention (row 3). We found that TMR (0.3V bias) is about 35% and 70%, respectively, for the reference $Ni_{88}Fe_{12}$ MTJ and Fe MTJ. Rp_cov of the 1 Mb MRAM MTJ is around 3.5% while TMR/(Rp_cov) for the $Ni_{88}Fe_{12}$ MTJ and Fe MTJ are 10 and 20, respectively. Thus, there is a good read margin for the MRAM comprised of a MTJ with a Fe free layer formed according to the present invention and a substantial improvement over the prior art.

Comparative Example 2

An experiment was conducted to compare the performance of an STT-RAM MTJ fabricated according to the first embodiment of the present invention with an STT-RAM MTJ based on a prior art CoFeB free layer. Results are shown in Table 2. The MTJ stack is formed on a Ta/Ru200/α-Ta100 bottom electrode and has the following succession of layers in order from bottom to top: 45 Angstrom NiCr seed layer; 150 Angstrom MnPt AFM layer; $CO_{75}Fe_{25}23/Ru7.5/CO_{60}Fe_{20}B_{20}15-CO_{75}Fe_{25}6$ SyAF pinned layer; MgO tunnel

TABLE 1

Magnetic Properties of MRAM MTJs with $NiCr45/MP150/Co_{75}Fe_{25}23/Ru7.5/Co_{60}Fe_{20}B_{20}21/MgO(ROX)$/free layer/Ta/Ru configuration

| Row | FL | Capping layer | Anneal | RA | MR | Bs | Hc | He | Hk | λs |
|---|---|---|---|---|---|---|---|---|---|---|
| 1 | $Ni_{88}Fe_{12}35$ | NiFe(12%)Hf18/Ta/Ru | 330 C. | 500 | 70 | 0.60 | 4.1 | −2.1 | 7.0 | 1.00E−07 |
| 2 | Fe21 | NiFe(12%)Hf10/Ta/Ru | 330 C. | 290 | 132 | 0.61 | 3.9 | −1.1 | 4.2 | 2.49E−06 |
| 3 | Fe24 | NiFe(12%)Hf10/Ta/Ru | 360 C. | 343 | 157 | 0.66 | 4.2 | −2.9 | 5.4 | 1.07E−07 |
| 4 | Fe30 | Ta/Ru | 360 C. | 242 | 173 | 0.62 | 4.8 | −7.2 | 7.8 | 1.20E−06 |

The reference MTJ in row 1 has a 35 Angstrom thick $Ni_{88}Fe_{12}$ free layer and provides a Bs=0.6, MR=70%, Hc=4.1 Oe, and a low magnetostriction (λs). When the NiFe free layer is replaced with a 21 Angstrom thick Fe layer in row 2 according to one embodiment of the present invention, RA is lowered to 290 ohm-μm², Hc is equivalent to the reference, and there is a two-fold increase in TMR (MR). Based on the inventors' experience with fabricating 4 Mb MRAMs, it is believed that a λs of $2.5 \times 10^6$ is higher than desirable. However, when the Fe free layer thickness is increased to 24 Angstroms and the annealing temperature is raised to 360° C. as shown in row 3, TMR is almost 160% and magnetostriction is equivalent to the reference MTJ (row 1).

barrier; free layer; and a capping layer with a 30 Angstrom thick lower Ta layer and an upper Ru layer 100 Angstroms thick. The MgO layer is formed by depositing an 8 Angstrom thick Mg layer on the pinned layer followed by a NOX process comprising exposure to a 1 torr atmosphere formed by employing a 0.1 to 1.0 slm oxygen flow rate for 60 to 100 seconds, and then deposition of a 4 Angstrom thick Mg layer on the oxidized first Mg layer.

TABLE 2

Magnetic Properties of STT-RAM MTJs with $NiCr45/MP150/Co_{75}Fe_{25}21/Ru7.5/Co_{60}Fe_{20}B_{20}15-Co_{75}Fe_{25}6/MgO(NOX)$/free layer/Ta30Ru100 configuration

| Row | Free layer | Anneal | RA | TMR | Bs | Hc | Hin | Hk | α (intrinsic) |
|---|---|---|---|---|---|---|---|---|---|
| 1 | $Co_{40}Fe_{40}B_{20}25*$ | 265 C.-2 hr | 9.7 | 103% | 0.55 | 11 | 3.7 | 34 | 0.0038 |
| 2 | Fe28 | 330 C.-2 hr | 9.6 | 103% | 0.52 | 3 | 2.7 | 6 | 0.0019 |
| 3 | $Fe/Co_{40}Fe_{40}B_{20}**/Fe$ | 330 C.-2 hr | 8.2 | 127% | 0.54 | 18 | 7.2 | 24.7 | 0.0035 |

*amorphous
**crystalline

Row 1 shows a prior art STT-MRAM MTJ in which there is a $Co_{40}Fe_{40}B_{20}$ free layer and post deposition annealing is 265° C. so that the CoFeB free layer is amorphous. RA is about 10 ohm-um², intrinsic TMR is 103%, and the intrinsic damping constant is 0.0038 as listed in a reference by M. Oogane et al. in "Magnetic damping in ferromagnetic thin film", Japn. J. Applied Phys., V 45, p 3889 (2006). Note that a crystalline $CO_{40}Fe_{40}B_{20}$ free layer has an intrinsic damping constant=0.0055 that is considerably higher than the amorphous sample in Row 1. Row 2 in Table 2 shows an STT-RAM MTJ fabricated according to an embodiment of the present invention in which the free layer is a 28 Angstrom thick Fe layer. Although Hc is lower than the reference Hc value, RA and TMR are essentially equivalent to that of the reference MTJ. The intrinsic damping constant for the Fe free layer is 0.0019 which represents a 50% reduction compared with the reference MTJ. Since the intrinsic critical current density (Jc) is directly related to the intrinsic damping constant ($\alpha$) as indicated in equation (1), the Jc value for the STT-RAM MTJ (row 2) should be substantially less than that for row 1. An STT-RAM MTJ having a Fe/CoFeB/Fe free layer according to one embodiment of the present invention was also characterized. The results in Row 3 are similar to Row 2. In particular, Hc and TMR can be increased by the addition of CoFeB to the Fe free layer although the damping constant is not reduced to the same extent as in Row 2 but is still an improvement compared with the standard free layer in Row 1.

We have fabricated STT-RAM test structures using the two MTJ stack configurations listed in rows 1 and 2 of Table 2. The MTJ cells were formed with the following sizes: 75 nm×150 nm, 100 nm×150 nm, and 100 nm×200 nm. Quasi-static testing of the STT-RAM MTJ cells has shown the voltage Vc for switching the Fe free layer is only ⅓ that for switching the conventional $CO_{40}Fe_{40}B_{20}$ free layer. High speed testing in the nanosecond scale has shown that $J_{c0}$ (intrinsic critical current density at 0° K) for switching the Fe free layer is only one half that for switching a conventional $CO_{40}Fe_{40}B_{20}$ free layer which is a substantial improvement over the prior art.

Thus, a novel free layer has been discovered that enables the read margin for conventional MRAM MTJs to be significantly improved for 90 nm design rules and beyond, and yields a substantially lower $J_{c0}$ for STT-RAM MTJs to substantially improve the switching performance over the prior art. The Fe or Fe/CoFeB/Fe free layer can be readily implemented with existing tools and processes. Similar to CoB and CoFeB, adding a small amount of about 5 atomic % of B into a Fe free layer can result in a lower Hc and enhanced thermal stability.

While this invention has been particularly shown and described with reference to, the preferred embodiment thereof, it will be understood by those skilled in the art that various changes in form and details may be made without departing from the spirit and scope of this invention.

We claim:

1. A method of forming a MRAM MTJ on a substrate, comprising:
   (a) sequentially forming a seed layer, AFM layer, and a pinned layer on said substrate, said pinned layer has an AP2/coupling layer/AP1 configuration wherein the AP2 layer is formed on an AFM layer and the AP1 layer contacts a MgO tunnel barrier layer;
   (b) forming a crystalline MgO tunnel barrier having a crystal orientation on the AP1 pinned layer by a process sequence comprising:
      (1) depositing a first Mg layer that contacts the AP1 layer;
      (2) performing a ROX method to convert said first Mg layer to a MgO layer; and
      (3) depositing a second Mg layer on the MgO layer;
   (c) forming a free layer consisting of a $FeB_x$ layer, or a composite with a Fe/CoFeB/Fe composition on the MgO tunnel barrier where x is between 0 and about 5 atomic %; and
   (d) forming a capping layer on the $FeB_x$ or Fe/CoFeB/Fe free layer.

2. The method of claim 1 wherein the AP2 layer is CoFe, the coupling layer is Ru, and the AP1 layer is CoFeB.

3. The method of claim 1 wherein the first Mg layer has a thickness from 8 to 12 Angstroms, the second Mg layer has a thickness from about 2 to 4 Angstroms, and the ROX process comprises a RF power of about 500 to 800 Watts, and an oxygen flow rate from about 0.4 to 0.8 slm for a period of about 80 to 150 seconds.

4. The method of claim 1 further comprised of annealing the MRAM MTJ layers along an easy axis direction by applying a magnetic field of about 5000 to 10000 Oe at a temperature between about 330° C. and 360° C. for a period of about 1 to 5 hours.

5. The method of claim 1 wherein the free layer is a Fe/CoFeB/Fe layer and wherein the Fe/CoFeB/Fe free layer has a lower Fe layer on the MgO tunnel barrier with a thickness from about 3 to 5 Angstroms, a middle CoFeB layer with a thickness of about 10 to 12 Angstroms, and an upper Fe layer with a thickness from about 5 to 6 Angstroms.

6. The method of claim 1 wherein the capping layer is comprised of a NiFeHf layer that contacts the free layer and a Ta layer on the NiFeHf layer.

7. A method of forming a STT-RAM MTJ on a substrate, comprising:
   (a) sequentially forming a seed layer, AFM layer, and a pinned layer on said substrate, said pinned layer has an AP2/coupling layer/AP1 configuration wherein the AP2 layer is formed on an AFM layer and the AP1 layer contacts a MgO tunnel barrier layer;
   (b) forming the MgO tunnel barrier having a crystal orientation on the AP1 pinned layer by a process sequence comprising:
      (1) depositing a first Mg layer on the AP1 layer;
      (2) performing a NOX method to convert said first Mg layer to a MgO layer; and
      (3) depositing a second Mg layer on the MgO layer;
   (c) forming a free layer consisting of a $FeB_x$ layer, or having a Fe/CoFeB/Fe composition on the MgO tunnel barrier where x is between 0 and about 5 atomic %; and
   (d) forming a capping layer on the $FeB_x$, or Fe/CoFeB/Fe free layer.

8. The method of claim 7 wherein the AP2 layer is CoFe, the coupling layer is Ru, and the AP1 layer is a composite comprised of a lower CoFeB layer on said coupling layer and an upper CoFe layer contacting the MgO tunnel barrier layer.

9. The method of claim 7 wherein the first Mg layer has a thickness from about 6 to 8 Angstroms, the second Mg layer has a thickness from about 3 to 5 Angstroms, and the NOX process comprises a 1 torr pressure and an oxygen flow rate from about 0.1 to 1.0 slm for a period of about 60 to 100 seconds.

10. The method of claim 7 further comprised of annealing the STT-RAM MTJ layers along an easy axis direction by applying a magnetic field of about 5000 to 10000 Oe at a temperature between about 300° C. and 350° C. for a period of about 1 to 5 hours.

11. The method of claim 7 wherein the free layer is a Fe/CoFeB/Fe free layer and wherein the Fe/CoFeB/Fe free layer has a lower Fe layer on the MgO tunnel barrier with a thickness from about 3 to 5 Angstroms, a middle CoFeB layer with a thickness of about 10 to 12 Angstroms, and an upper Fe layer with a thickness from about 5 to 6 Angstroms.

* * * * *